United States Patent
Allais et al.

(10) Patent No.: US 8,470,744 B2
(45) Date of Patent: Jun. 25, 2013

(54) HIGH TEMPERATURE SUPERCONDUCTOR, IN PARTICULAR IMPROVED COATED CONDUCTOR

(75) Inventors: Arnaud Allais, Bonn (DE); Mark O. Rikel, Huerth (DE); Jürgen Ehrenberg, Huerth (DE)

(73) Assignee: Nexans, Paris (FR)

( * ) Notice: Subject to any disclaimer, the term of this patent is extended or adjusted under 35 U.S.C. 154(b) by 264 days.

(21) Appl. No.: 12/836,795

(22) Filed: Jul. 15, 2010

(65) Prior Publication Data

US 2012/0015817 A1    Jan. 19, 2012

(30) Foreign Application Priority Data

Aug. 13, 2009   (EP) .................................... 09305754

(51) Int. Cl.
*H01L 39/24*    (2006.01)
(52) U.S. Cl.
USPC ........................................................ 505/237
(58) Field of Classification Search
USPC ............... 505/220, 237, 434, 410, 446, 470; 174/125.1; 427/62
See application file for complete search history.

(56) References Cited

U.S. PATENT DOCUMENTS

| | | | | |
|---|---|---|---|---|
| 5,047,388 | A * | 9/1991 | Rohr et al. | 505/470 |
| 6,552,415 | B1* | 4/2003 | Paul et al. | 257/661 |
| 7,496,390 | B2* | 2/2009 | Thieme et al. | 505/231 |
| 7,627,356 | B2* | 12/2009 | Zhang et al. | 505/231 |
| 2007/0232500 | A1 | 10/2007 | Selvamanickam et al. | |
| 2008/0119365 | A1 | 5/2008 | Allais et al. | |
| 2009/0170709 | A1 | 7/2009 | Allais et al. | |

FOREIGN PATENT DOCUMENTS

DE      4004908      8/1991

* cited by examiner

*Primary Examiner* — Colleen Dunn
(74) *Attorney, Agent, or Firm* — Sofer & Haroun, LLP

(57) ABSTRACT

A coated conductor is provided with improved electrical connection between the conductive layers such as the high temperature superconductor layer and a metal protection layer applied onto the high temperature superconductor layer and the substrate. A method includes obtaining such electrical connection, in particular, creating a coated conductor wherein the substrate is a core covered with the layers all around its periphery.

10 Claims, 1 Drawing Sheet

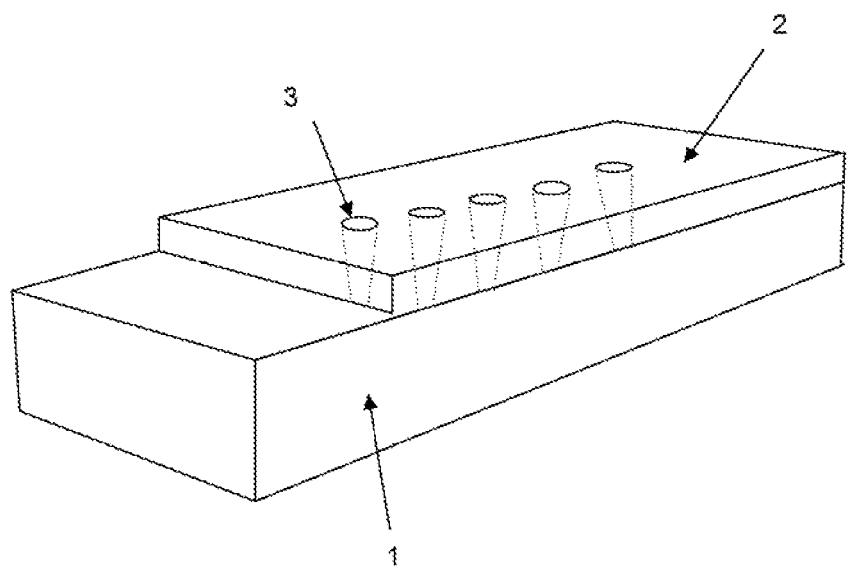

HIGH TEMPERATURE SUPERCONDUCTOR, IN PARTICULAR IMPROVED COATED CONDUCTOR

RELATED APPLICATION

This application claims the benefit of priority from European Patent Application No. 09 305 754.5, filed on Aug. 13, 2009, the entirety of which is incorporated by reference.

BACKGROUND

1. Field of the Invention

The present invention relates to a high temperature superconductor, in particular to a high temperature superconductor known as coated conductor.

2. Description of Related Art

Coated conductors, which are also referred to as "second generation superconductors" typically have a long length as required, for example, in the production of wires and cables.

They are composed of a substrate onto which is applied a multilayer structure with a high temperature (hts) superconductor layer and at least one buffer layer between the substrate and the high temperature superconductor layer. Typically, the buffer layer(s) are made of ceramic material having high resistance. The buffer layer(s) serve to compensate for the various different properties of the materials used. For example, buffer layers can be provided for preventing poisoning of the superconductor layer by constitutional elements of the substrate which might diffuse towards the superconductor layer.

Preferably, the hts layer is covered by a protection layer made of a noble metal or noble metal alloy.

In general, high temperature superconductors, such as coated conductors, are promising candidates for a plurality of applications such as high and medium voltage power transmission cables, wire applications, fault current limiters, transformers, magnets (for example, for magnetic resonance imaging) and synchronous motors with superconducting windings.

In the superconducting state the resistance of a high temperature superconductor material is practically zero. However, all superconductor materials can loose their superconductor properties by exceeding one or more of the critical temperature (Tc), the critical magnetic field (Hc) or the critical current (Ic). These factors are given for a specific superconductor material.

In practical, the superconductor material of a superconductor component such as a coated conductor is not completely homogenous throughout the whole component so that the above properties such as the critical current can be different in different regions of the superconductor layer. Consequently, in case of fault such as a large surge current, some regions of the superconductor layer may loose their superconductor properties and become resistive whereas other regions still remain superconducting. Due to the still superconducting regions high current flows through the superconductor layer which leads to a temperature increase in the already resistive regions and may cause burn out or thermal run-away.

For avoiding break down and damage in case of fault all conductive layers within the layer structure, such as the hts layer and the metal protection layer, must be electrically connected to the substrate. Since the substrate and the hts layer with or without metal protection layer, are electrically separated by the ceramic buffer layers an electrical connection must be provided which bridges the insulating buffer layers.

Typically, a coated conductor has a tape-like shape with plane faces wherein the layer structure is applied onto one of the plane faces.

Recently, also coated conductors with circular cross-section have been described, wherein the substrate forms a core which is covered by the layer structure. The core may be hollow, such as a tube, or may be solid such as a rod. For example, such "round coated conductors" and methods for production thereof are disclosed in US 2008/0119365 A1 and EP 1 916 720 A1 which are incorporated herein by reference.

Another example is disclosed in US 2007/0232500 A1.

In flat coated conductor tapes electrical connection of the metal protection layer and the superconductor layer with the substrate can be accomplished by simply providing a metal connection along at least the longitudinal edges of the tape with the metal connection extending from the substrate to the metal protection layer and forming a conductive path.

However, this solution is not applicable in a coated conductor wherein the layer structure surrounds the whole periphery of the substrate as in a coated conductor with circular cross-section with the layer structure surrounding the core.

According to US 2007/0232500 A1 this problem is solved by bending a pre-fabricated tape composed of the layer structure along its longitudinal axis around the core. As such the opposite longitudinal edges of the tape composed of the layer structure ubut face to face forming a longitudinal slot therebetween. The longitudinal slot extends from the outer surface of the layer structure to the surface of the core. For forming an electrical connection between the metal protection layer and the hts layer underneath the metal protection layer and the core the slot is filled with a metal.

However, according to this solution the position of the electrical connection is pre-determined and cannot be freely selected. Further, this solution is restricted to the case that a pre-fabricated tape-like layer structure is bent around a core, so that a longitudinal slot is formed.

U.S. Pat. No. 6,552,415 B1 and DE 40 04 908 A1 relate to a method for providing a conductive path in a coated conductor composed of a substrate, buffer layer(s) and a high temperature superconductor layer by providing through-holes which extends through the high temperature superconductor layer and the buffer layer(s) to the surface of the substrate. Then, a metal protection layer is deposited onto the high temperature superconductor layer, wherein the metal fills up the through-holes thereby forming a conductive connection with the substrate.

According to DE 40 04 908 A1 this method is also applied to a cylindrical coated conductor.

However, there is a disadvantage, that through-holes must be provided through the high temperature superconductor layer with the risk that the high temperature superconductor layer is impaired.

OBJECTS AND SUMMARY

It was the object of the present invention to provide a coated conductor with improved electrical connection between the conductive layers of the layer structure such as the superconducting layer and the metal protection layer, and the metal substrate. In particular, it was the object of the present invention to provide such an electrical connection wherein the position of the electrical connection can be freely selected. According to a further aspect it was the object of the present invention to provide a method for producing an improved conductive path within a coated conductor with a core covered by the layer structure wherein the position of the conductive path is freely selectable.

According to the present invention this problem is solved by a coated conductor comprising a metal substrate and a layer structure wherein the layer structure is composed of at least one buffer layer, a high temperature superconductor layer deposited onto the uppermost buffer layer and, optionally, a metal protection layer deposited onto the high temperature superconductor layer wherein within the layer structure at least one conductive path is provided which electrically connects the high temperature superconductor layer of the layer structure with the metal substrate.

BRIEF DESCRIPTION OF THE DRAWING

The present invention is further illustrated by the accompanying FIGURE. It is shown in FIG. 1 an embodiment for the production of the coated conductor according to the present invention.

DETAILED DESCRIPTION

The term "conductive layer" is understood to mean any layer within the layer structure which is electrically conductive such as the high temperature superconductor layer, the metal protection layer or any other electrically conductive layer which might be present.

The term "conductive path" is understood to mean any means suitable to form an electrical connection between the conductive layer(s) of the layer structure and the substrate onto which the layer structure is provided.

The term "layer structure" is understood to mean a stack of layers conventionally applied onto a substrate for forming a coated conductor.

The term "coated conductor with a core covered by a layer structure" is understood to mean a coated conductor comprising a core which is surrounded by the layer structure around its periphery with a longitudinal slot along the longitudinal extension of the layer structure only or with a longitudinal slot extending along the longitudinal extension of both the layer structure and the core as disclosed in US 2007/0232500 A1 and in EP 1 916 720 A1, or a coated conductor wherein the layer structure surrounds the core all around its periphery as disclosed in US 2008/0119365 A1, each in contrast to a tape-shaped coated conductor wherein onto a plane face of the substrate tape the structure layer is applied.

The term "conductive path within the layer structure" is understood to mean that the conductive path forms at least one island within the layer structure wherein the island is completely surrounded by the layer structure in contrast to the layer structures according to EP 1 916 720 A1 and US 2007/0232500 A1 wherein the layer structure is cut through all along its longitudinal extension so that a slot is formed extending along the longitudinal extension of the layer structure.

The present invention is likewise applicable for coated conductor tapes with plane surface and for coated conductors with a core covered by the layer structure.

According to the present invention the conductive path is formed by at least one through-hole provided within the layer structure which extends from the uppermost buffer layer i. e. the buffer layer onto which the high temperature superconductor is deposited, to the surface of the metal substrate, and wherein at least onto the bottom of the through-hole a conductive area is provided. The number of through-holes as well as the distribution of through-holes over the layer structure is not particularly restricted and can be selected according to need.

Also the shape of cross-sectional area of the through-hole is not particularly restricted. It may be round, oval, polygonal with three or more angles etc. It may be also a slit.

For forming the conductive path at least at the bottom of the through-hole, i. e. surface part of the substrate, a conductive area is provided composed of a metal or, alternatively, the through-holes may be filled up with a metal or metal alloy.

Once more, there is no particular restriction as to the number, distribution and shape of the through-holes as long as there is a suitable electrical connection. Preferably the metal or metal alloy is the same as the metal or metal alloy of the metal protection layer.

For the present invention any high temperature superconductor material may be used. Preferably, the high temperature superconductor material is a ceramic oxide high temperature superconductor material or $MgB_2$. Preferably, the ceramic oxide high temperature superconductor material is selected from the group consisting of bismuth-based, thallium-based, yttrium-based, and mercury-based ceramic oxide superconductors.

Typical examples comprise ceramic oxide high temperature superconductors based on Bi—Ae—Cu—$O_y$, (Bi, Pb)—Ae—Cu—$O_y$, Re—Ae—Cu—$O_y$, (Tl, Pb)—Ae—Cu—O or Hg—Ae—Cu—$O_y$. In each of the above formulas y represent the relative oxygen content in the range appropriate for the particular superconductor material, Ae means at least one alkaline earth element, particularly, Ba, Ca and/or Sr, Re means at least one rare earth element, particularly Y or a combination of two or more of the elements Y, La, Lu, Sc, Ce, Nd or Yb.

Alternatively, precursors of the superconductor materials can be used. Precursors are mixtures of oxides that collectively have the same nominal composition as the superconductor material and which form a superconductor material upon heating.

In particular, suitable ceramic oxide high temperature superconductors are those known by the reference BSCCO-2212, BSCCO-2223, wherein the numerical combinations 2212 and 2223 stand for the stoichiometric ratios of the elements Bi, Sr, Ca and Cu, preferably those, wherein part of Bi is substituted by Pb; and those known by the reference YBCO-123 and YBCO-211, wherein the numerical combinations 123 and 211 stand for the stochiometric rations of the elements Y, Ba and Cu.

More preferably, the ceramic oxide superconductor material is a rare earth barium cuprate type-superconductor of the formula $ReBaCuO_y$ with Re and y are as defined above. Most preferably, the ceramic oxide high temperature superconductor material is YBCO-123.

In principle, coated conductors and processes for manufacturing are well known in the art and are widely described.

Examples of metals suitable as substrate such as a tape or core are copper, nickel, silver, iron and alloys thereof.

Typical buffer layers are ceramic oxides and include cerium oxide, yttrium-stabilized zirconia (YSZ), strontium titanium oxide, rare earth aluminates, oxides of general formula $Re_2A_2O_7$ with Re as defined above and A being selected from Zr and Hf, in particular $La_2Zr_2O_7$ (LZO), and various rare-earth oxides.

The metal protection layer is typically a noble metal or noble metal alloy, for example gold, silver, platinum and palladium or alloys thereof. Silver or silver alloys are preferred in view of their comparatively low costs. These metals or metal alloys are also suitable in the production of the conductive area at the bottom of the through-holes and/or for filling up the through-holes.

In view of good superconductor properties the orientation or alignment of the crystal grains of the superconductor material should be as high as possible. Preferably, the superconductor layer should have a biaxial texture with the crystal grains being aligned both parallel to the plane of the layer (a-b alignment) and perpendicular to the plane of the layer (c-axis alignment).

Generally, texturing or orientation of the superconductor layer can be accomplished by to different approaches.

According to the so-called IBAD (ion beam assisted deposition) approach, a highly textured buffer layer is deposited by ion beam assisted deposition on a randomly oriented metallic substrate, said buffer layer serves to transfer the desired texture to the superconductor layer grown onto the buffer layer.

According to another approach substrates are used which are already textured, for example, by mechanical deformation followed by recrystallisation annealing. A specific example for such a method is called RABiTs (rolling assisted biaxially textured substrates). On such textured substrates as obtained by RABiTs buffer layers can be grown in a suitable texture, which, in turn, can serve as template for transferring the desired texture to a superconductor layer to be grown on the buffer layer.

For the present invention both approaches are likewise suitable, but using an already textured substrate being preferred.

Suitable methods for growing buffer layers for coated conductors include, for example, vacuum methods, such as physical vapor deposition (PVD), pulsed laser deposition (PLD), electron beam evaporation and sputtering as well as non-vacuum deposition processes such as chemical solution deposition, chemical vapor deposition (CVD) and metal organic chemical vapor deposition (MOCVD).

Suitable methods for depositing the superconductor layer include a wide variety of physical and chemical deposition processes, such as metal organic chemical vapor deposition, thermal evaporation, metal organic deposition and others.

According to the present invention the through-holes can be provided by etching the buffer layer(s) punctually or in line prior to the deposition of the hts layer, removing the etched parts, providing a conductive area onto the bottom of the through-holes or filling up the through-holes with a metal or metal alloy and then, depositing the hts layer.

Methods for selective edging and edging materials are well known in the art of contactor preparation. Examples for suitable edging materials are fluorine containing organic compounds such as trifluoroacetic acid, and hydrochloric acid.

Removal of the etched material can be assisted by laser or plasma.

According to another method the conductive path can be formed by providing treated areas onto the substrate. The treated areas are treated in a manner that no buffer layer can be grown or adhere thereon. For example, such treated areas can be formed onto the substrate by treating with an anti-wetting agent. A suitable anti-wetting agent should be chemically inert to oxygen and to the high temperature superconductor material. Further, for achieving sharp borders of the treated areas the anti-wetting agent used should essentially not spread. Examples for suitable anti-wetting agents are glues and greases such as silicone oils of appropriate viscosity. Examples for suitable glues are conventional 2 components glues such as UHU plus.

Upon deposition of the buffer layer(s) the material forming the buffer layer is prevented from adhering to said treated areas treated with the anti-wetting agent and can be removed. For example, removal can be achieved upon heating the deposited material for crystallization to form the final buffer layer. In case, that conductive areas are provided onto the bottom of the through-holes the hts-material of the hts-layer can infiltrate into the through-holes and fill up the through-holes thereby coming into contact to the conductive area onto the bottom. According to a preferred embodiment the material with which the treated areas are treated, such as the anti-wetting agent can already contain a powder of conductive material such as a metal or metal alloy as referred to above.

Alternatively, the holes obtained can be filled with a conductive material, such as a metal, in particular a noble metal, preferably silver or silver alloy, as referred to the above.

Onto the bottom of the through-holes thus obtained a conductive material can be applied and a high temperature superconductor layer grown onto the buffer layer simultaneously fills up the through-holes and come into contact with the conductive area, thereby forming the conductive path. If the material for treating the treated area already comprises a metal powder, upon removal of the buffer layer material the conductive area is automatically obtained by the metal material admixed to said material.

By the conductive areas a conducting path is formed connecting the conductive layers of the layer structure such as the high temperature superconductor layer and the metal protection layer with the metal substrate.

This method is in particular advantageous since it is not necessary to selectively destroy any already deposited hts-layer.

With reference to FIG. 1 a preferred embodiment for this manufacturing method is further explained in the following.

A plurality of treated areas are provided onto a textured metallic substrate 1 by applying a glue, for example, UHU Plus, wherein the glue is mixed with silver powder. Silver powder is added to the glue in a sufficient amount to provide the desired electrical contact. A buffer layer 2, for example, LZO layer, is provided onto the substrate 1 by metal organic deposition. To this a solution with a suitable precursor material is deposited onto the substrate 1. For forming and re-crystallization of the buffer layer 2 the substrate 1 with the precursor solution deposited thereon is heat-treated at a temperature of about 1000° C. During heat treatment the buffer material is formed and the solvent is vaporized. At the treated areas crystallization of the precursor material is prevented and, further, at the temperature of the heat treatment the glue material is evaporated leaving the silver powder on the bottom of the through holes 3 formed in the buffer layer 2.

Some buffer material might remain within the treated areas, but the amount is negligible and does not influence the electrical contact provided by the silver powder.

The present invention provides a coated conductor with improved conductive path connecting electrically the conductive layers such as the high temperature superconductor layer 2 and the metal protection layer formed thereon with the substrate 1. Further, by the present invention such a conductive path can be formed in simple manner without any restriction as to the position of the conductive path.

The invention claimed is:

1. Coated conductor, comprising:
   a metal substrate; and
   a layer structure, wherein the layer structure is made of:
      at least one buffer layer, and
      a high temperature superconductor layer; and
      wherein, within the layer structure, at least one conductive path is provided for electrically connecting the conductive layers of the layer structure with the metal substrate, wherein the conductive path is formed by at least one through-hole extending through the at least one buffer layer to the substrate, wherein the at least one through-hole does not extend through the high temperature superconductor layer, and wherein the high temperature superconductor layer, provided onto the upper most buffer layer is in electrical contact with the substrate via the at least one through-hole.

2. Coated conductor according to claim 1, wherein the at least one through-hole is filled with a conductive metal.

3. Coated conductor according to claim 1, wherein the coated conductor has a tape shape.

4. Coated conductor according to claim 1, wherein the coated conductor is composed of a core which is surrounded by the layer structure.

5. Coated conductor according to claim 4, wherein the shape of the cross-sectional area of the core is selected from the group consisting of a round, oval and polygonal shape.

6. Coated conductor according to claim 1, wherein the high temperature superconductor is selected from the group consisting of Bi—Ae—Cu—O, (Bi, Pb)—Ae—Cu—$O_y$, Re—Ae—Cu—O, (Tl, Ph)—Ae—Cu—O, Hg—Ae—Cu—$O_y$, or $MgB_2$, wherein y represents the relative oxygen content, Ac is at least one alkaline earth element, and Re is at least one rare earth element.

7. Coated conductor according to claim 6, wherein the high temperature superconductor is YBCO-123.

8. Coated conductor according to claim 1, wherein onto the surface of the substrate on the bottom of the at least one through-hole an electrically conductive material is applied for forming a conducting area onto the surface of the substrate.

9. Coated conductor according to claim 8, wherein the conductive material is selected from silver, platinum, gold and silver alloy.

10. Coated conductor according to claim 8, wherein the layer structure further includes a metal protection layer.

* * * * *

UNITED STATES PATENT AND TRADEMARK OFFICE
CERTIFICATE OF CORRECTION

PATENT NO.        : 8,470,744 B2
APPLICATION NO.   : 12/836795
DATED             : June 25, 2013
INVENTOR(S)       : Allais et al.

It is certified that error appears in the above-identified patent and that said Letters Patent is hereby corrected as shown below:

In the Claims

Claim 6, Column 8, Line 3: The formula "Bi-Ae-Cu-O" between the word "of" and "," should read "Bi-Ae-Cu-Oy"
(Please note - the "y" after the "O" in the above formula is a subscript - please see listing of claims)

Claim 6, Column 8, Line 4: The formula "(Tl, Ph)-Ae-Cu-O," between the formulas "Re-Ae-Cu-O" and "Hg-Ae-Cu-Oy" should read "(Tl, Pb)-Ae-Cu-O,"

Claim 6, Column 8, Line 4: The formula "Re-Ae-Cu-O" between the formulas "(Bi, Pb)-Ae-Cu-Oy" and "(Tl, Ph)-Ae-Cu-O," should read "Re-Ae-Cu-Oy"
(Please note - the "y" after the "O" in the above formula is a subscript - please see listing of claims)

Claim 6, Column 8, Line 6: "Ac" between the words "content," and "is" should read "Ae"

Signed and Sealed this
Twentieth Day of August, 2013

Teresa Stanek Rea
*Acting Director of the United States Patent and Trademark Office*